(12) United States Patent
Shimizu (10) Patent No.: US 12,374,603 B2
(45) Date of Patent: Jul. 29, 2025

(54) SEMICONDUCTOR DEVICE AND METHOD FOR MANUFACTURING SEMICONDUCTOR DEVICE

(71) Applicants: KABUSHIKI KAISHA TOSHIBA, Minato-ku (JP); TOSHIBA INFRASTRUCTURE SYSTEMS & SOLUTIONS CORPORATION, Kawasaki (JP)

(72) Inventor: Kazuki Shimizu, Ota (JP)

(73) Assignees: Kabushiki Kaisha Toshiba, Minato-ku (JP); Toshiba Infrastructure Systems & Solutions Corporation, Kawasaki (JP)

(*) Notice: Subject to any disclaimer, the term of this patent is extended or adjusted under 35 U.S.C. 154(b) by 304 days.

(21) Appl. No.: 17/276,560

(22) PCT Filed: Sep. 12, 2019

(86) PCT No.: PCT/JP2019/035905
§ 371 (c)(1),
(2) Date: Mar. 16, 2021

(87) PCT Pub. No.: WO2020/202600
PCT Pub. Date: Aug. 10, 2020

(65) Prior Publication Data
US 2022/0005748 A1    Jan. 6, 2022

(30) Foreign Application Priority Data
Mar. 29, 2019  (JP) ................. 2019-067284

(51) Int. Cl.
*H01L 21/768*  (2006.01)
*H01L 23/482*  (2006.01)
*H10D 64/23*   (2025.01)

(52) U.S. Cl.
CPC .... *H01L 23/4821* (2013.01); *H01L 21/76834* (2013.01); *H10D 64/251* (2025.01)

(58) Field of Classification Search
CPC ................................................ H01L 23/4821
See application file for complete search history.

(56) References Cited

U.S. PATENT DOCUMENTS

| | | | | |
|---|---|---|---|---|
| 5,677,574 A | * | 10/1997 | Hisaka | H01L 23/5381 257/776 |
| 6,037,245 A | * | 3/2000 | Matsuda | H01L 29/66462 438/668 |
| 2013/0228789 A1 | * | 9/2013 | Yamamura | H01L 29/772 257/195 |

FOREIGN PATENT DOCUMENTS

| | | |
|---|---|---|
| JP | 61-95554 A | 5/1986 |
| JP | 9-199584 A | 7/1997 |

(Continued)

OTHER PUBLICATIONS

Nec et al., 1986, JPS6195554 (A) english Abstract and enedited computer generated English translation, 1986.*

(Continued)

*Primary Examiner* — Ajay Ojha
*Assistant Examiner* — Hajar Kolahdouzan
(74) *Attorney, Agent, or Firm* — Maier & Maier, PLLC (57) ABSTRACT

A method for manufacturing a semiconductor device includes a process of providing two source electrodes on a substrate, a process of providing a gate electrode on one surface of the substrate between the two source electrodes, a process of providing an insulating film on the gate electrode, the substrate, and side surfaces of the two source electrodes, a process of providing an airbridge foundation resist on the insulating film, providing an airbridge on the two source electrodes and the airbridge foundation resist, and a process of removing the airbridge foundation resist, in (Continued)

which surfaces of the two source electrodes at sides opposite to the substrate and a front surface of the airbridge foundation resist provided in the subsequent process are substantially coplanar.

7 Claims, 8 Drawing Sheets

(56) References Cited

FOREIGN PATENT DOCUMENTS

| JP | 2000-22131 A | 1/2000 |
| JP | 2006-80308 A | 3/2006 |
| JP | 2016-12737 A | 1/2016 |

OTHER PUBLICATIONS

Nec et al., 1986, JPS6195554 (A) english Abstract and enedited computer generated English translation, 1986 (Year: 1986).*
NEC document (Year: 1986).*
International Search Report issued on Nov. 12, 2019 in PCT/JP2019/035905 filed on Sep. 12, 2019, 2 pages.
English translation of International Preliminary Report on Patentability and Written Opinion issued Oct. 14, 2021 in PCT/JP2019/035905, 10 pages.
Extended European Search Report issued on Dec. 8, 2022, in corresponding European Application No. 19923204.2, 10 pages.

* cited by examiner

SEMICONDUCTOR DEVICE AND METHOD FOR MANUFACTURING SEMICONDUCTOR DEVICE

TECHNICAL FIELD

Embodiments of the invention relate to a semiconductor device and a method for manufacturing a semiconductor device.

BACKGROUND ART

There are cases where an airbridge is provided on the substrate of a semiconductor device to electrically connect two source electrodes that are provided to be separated. By using the airbridge to perform the interconnection, it is possible to connect the source electrodes to each other without contacting a gate electrode or other electrodes between the source electrodes.

Figure 1:
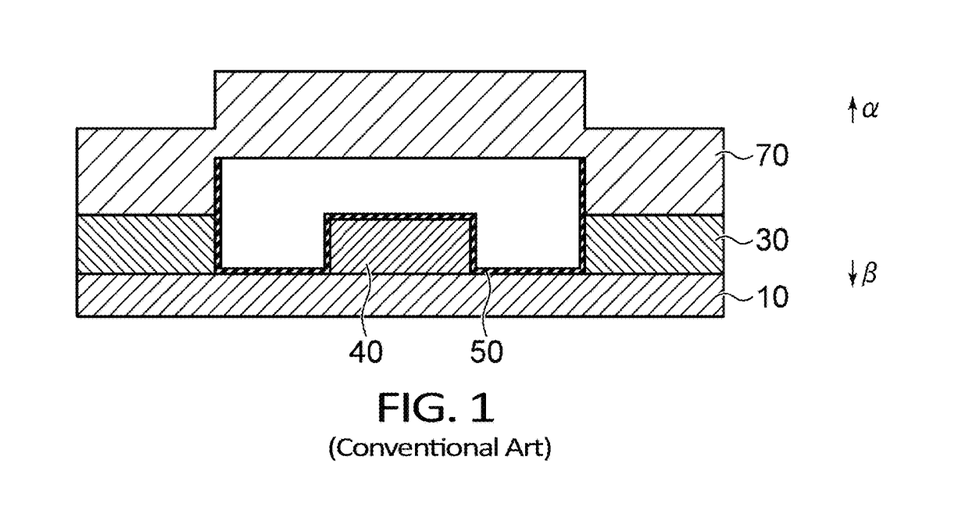
FIG. 1 is a cross-sectional view schematically illustrating a conventional semiconductor device.

For example, a conventional airbridge is provided as in FIG. 1. FIG. 1 shows the cross section of a conventional semiconductor device; and source electrodes 30 are provided on a substrate 10. An airbridge 70 is provided to connect the source electrodes 30 at the left and right without contacting a gate electrode 40.

However, in the conventional airbridge 70 as shown in FIG. 1, the heights are different for the portions provided on the source electrodes 30 and the portion provided above the gate electrode 40; and the portion above the gate electrode 40 has an upwardly convex shape. Here, an α-direction is taken as up, and a β-direction is taken as down. When an external force is applied from the upward direction, a concentrated force is applied to the portion that has the convex shape; therefore, there is a risk of short-circuit/damage of the element due to the airbridge and the gate electrode approaching and contacting each other and/or damage of the airbridge.

PRIOR ART DOCUMENTS

Patent Literature

[Patent Literature 1]
Japanese Patent Application S61-95554 (Kokai)

SUMMARY OF INVENTION

Technical Problem

A problem to be solved by the invention is to provide a semiconductor device and a method for manufacturing a semiconductor device in which the strength of an airbridge provided in the semiconductor device is increased.

Solution to Problem

A method for manufacturing a semiconductor device according to an embodiment includes a process of providing two source electrodes on a substrate, a process of providing a gate electrode on one surface of the substrate between the two source electrodes, a process of providing an insulating film on the gate electrode, the substrate, and side surfaces of the two source electrodes, a process of providing an airbridge foundation resist on the insulating film, providing an airbridge on the two source electrodes and the airbridge foundation resist, and a process of removing the airbridge foundation resist, in which surfaces of the two source electrodes at sides opposite to the substrate and a front surface of the airbridge foundation resist provided in the subsequent process are substantially coplanar.

DESCRIPTION OF EMBODIMENTS

First Embodiment

A method for manufacturing a semiconductor device 100 according to the embodiment will now be described based on the drawings.

Figure 2:
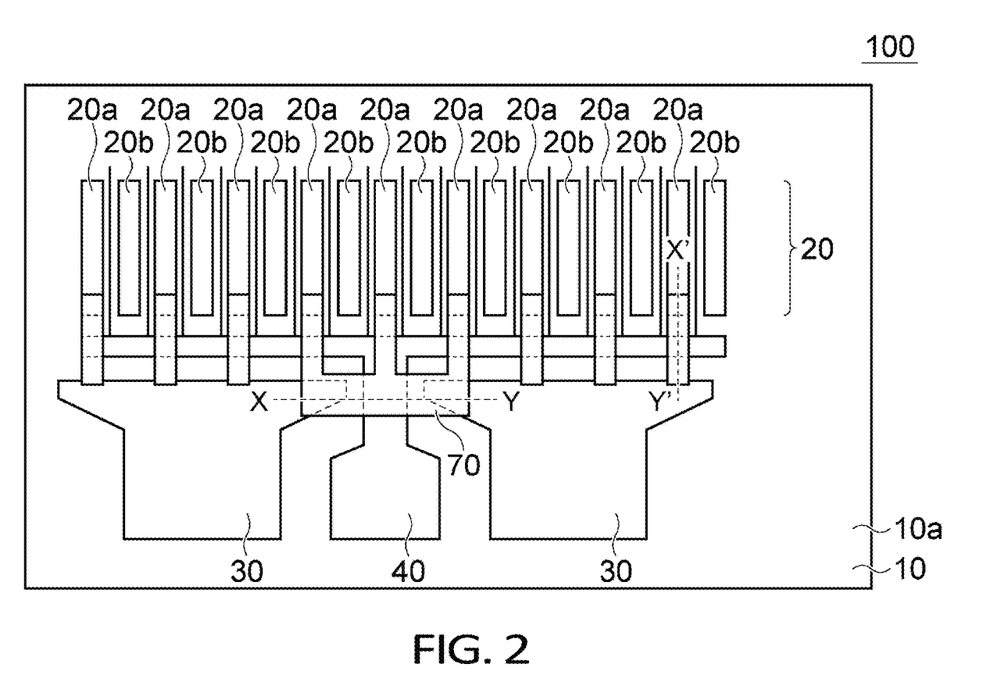
FIG. 2 is a drawing schematically illustrating a semiconductor device according to a first embodiment.

FIG. 2 is a drawing illustrating the semiconductor device 100 according to the embodiment.

A pair of source electrodes 30 and the gate electrode 40 are provided on one surface 10a of the substrate 10. In the description hereinbelow, the one surface 10a of the substrate 10 on which the pair of source electrodes 30 and the gate electrode 40 are provided is called an upper surface 10a. The source electrode 30 and the gate electrode 40 of FIG. 2 are pad electrodes, and are provided as pad electrodes because the other ohmic electrodes and gate electrodes have small surface areas and are difficult to connect with an external circuit.

The pair of source electrodes 30 is separated from each other. Also, ohmic electrodes 20 are provided to be arranged on the substrate 10. The ohmic electrodes 20 include a source electrode 20a and a drain electrode 20b that are alternately arranged.

The gate electrode 40 is provided between two adjacent source electrodes 30 and is separated from the source electrodes 30. Also, the gate electrode 40 is provided between the ohmic electrodes 20 and the source electrodes 30 to be separated from and not connected with the surrounding electrodes.

The two adjacent source electrodes 30 are electrically connected by the airbridge 70. Also, the source electrode 30 and the source electrodes 20a are electrically connected by the airbridge 70.

Figure 3:
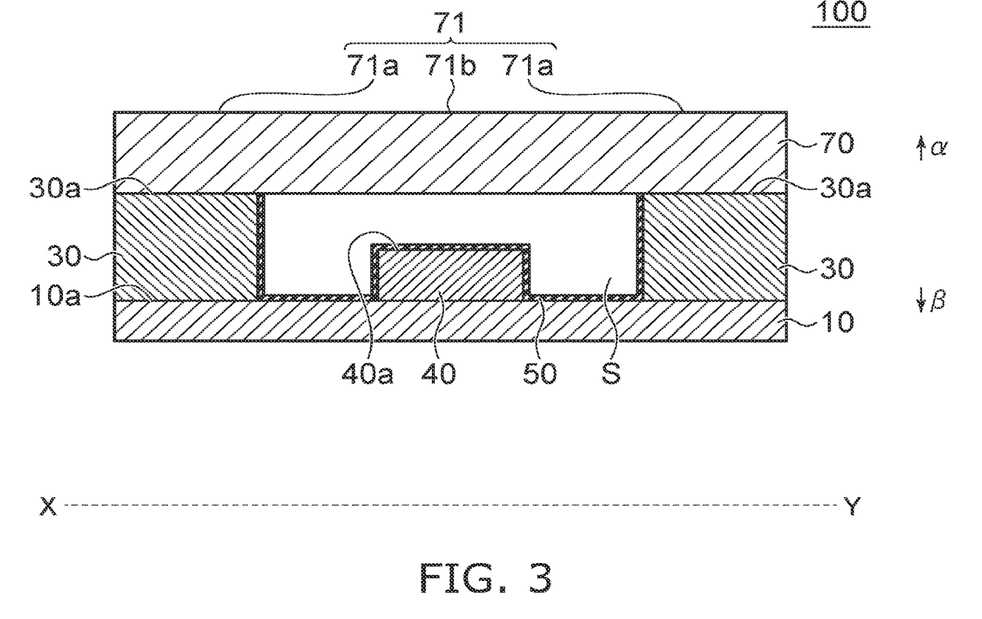
FIG. 3 is a drawing schematically illustrating a cross section of the semiconductor device according to the first embodiment.

FIG. 3 is a drawing schematically illustrating a cross section of the semiconductor device according to the embodiment.

FIG. 3 illustrates the X-Y cross-sectional view of FIG. 2. Here, the α-direction is taken as up, and the β-direction is taken as down. Two source electrodes 30 are provided on the semiconductor substrate 10. Here, the surface of the source electrode 30 at the substrate 10 side is called the first surface or the lower surface; and the surface of the source electrode 30 at the side opposite to the substrate 10 side is called the second surface or an upper surface 30a. The upper surfaces 30a (the second surfaces) of these two source electrodes 30 are substantially coplanar. The gate electrode 40 is provided between these two source electrodes 30 and is separated from these two source electrodes 30. An upper surface 40a of the gate electrode 40 is lower than the upper surfaces 30a of the pair of source electrodes 30. An airbridge 70 is provided on the two source electrodes 30 to electrically connect the source electrodes 30 to each other without contacting the gate electrode 40 between the pair of source electrodes 30 or other electrodes provided on the substrate 10. The airbridge 70 is provided to be separated from the substrate 10 and the gate electrode 40 by a space S. The airbridge 70 is connected to the upper surfaces 30a of the pair of source electrodes 30.

As shown in FIG. 3, an insulating film 50 is provided on the gate electrode 40, the substrate 10, and the side surfaces of the source electrodes 30. The insulating film 50 covers the surface of the substrate 10 facing the space S, the surfaces of the pair of source electrodes 30 facing the space S, and the surface of the gate electrode 40 facing the space S.

The airbridge 70 is provided on the upper surfaces 30a (the second surfaces) of the source electrodes 30, is formed to have substantially the same thickness regardless of location, and is formed in a state substantially without an unevenness. In other words, an upper surface 71 of the airbridge 70 includes a pair of first regions 71a facing the pair of source electrodes 30, and a second region 71b positioned between the pair of first regions 71a, so that the second region 71b is located at substantially the same position as the pair of first regions 71a in the vertical direction.

Figure 4A:
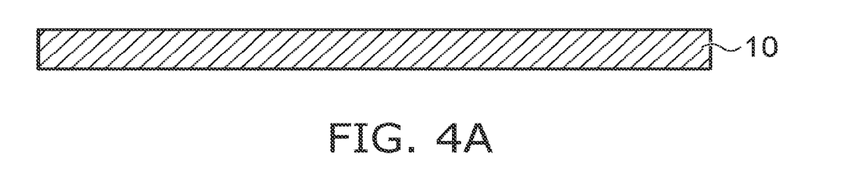
FIG. 4A is a drawing illustrating a method for manufacturing the semiconductor device according to the first embodiment.
Figure 4B:
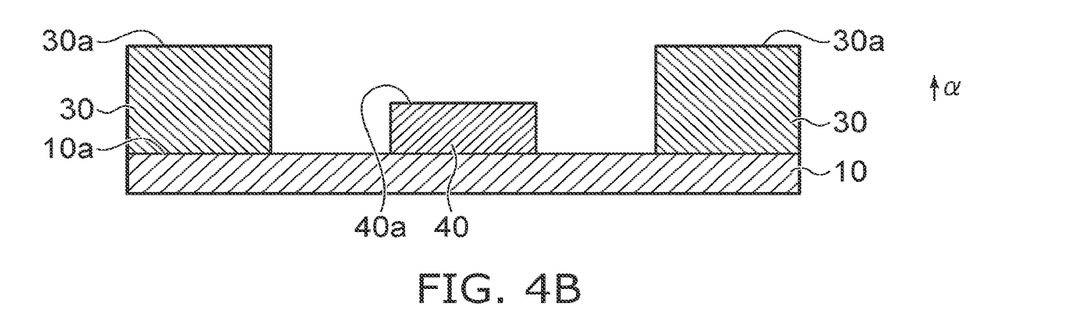
FIG. 4B is a drawing illustrating the method for manufacturing the semiconductor device according to the first embodiment.
Figure 4C:
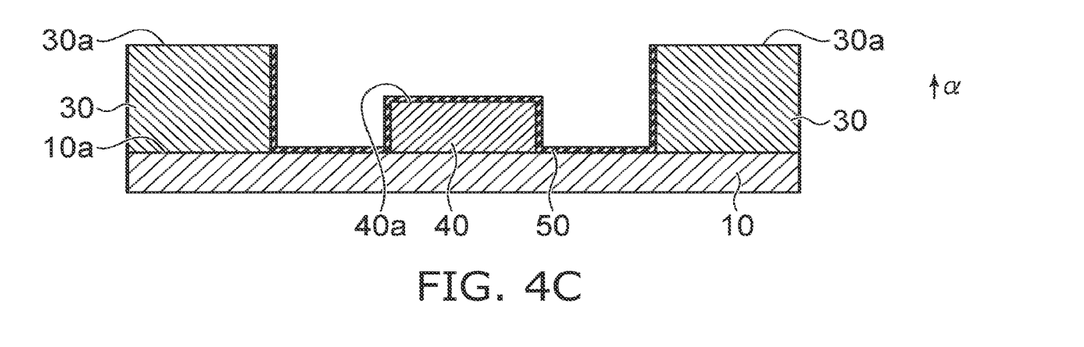
FIG. 4C is a drawing illustrating the method for manufacturing the semiconductor device according to the first embodiment.

FIGS. 4A to 4C are drawings illustrating a method for manufacturing the semiconductor device according to the embodiment.

Figure 5A:
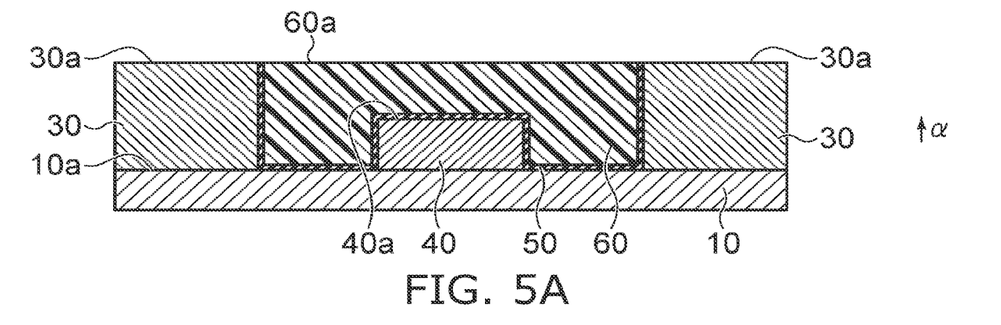
FIG. 5A is a drawing illustrating the method for manufacturing the semiconductor device according to the first embodiment.
Figure 5B:
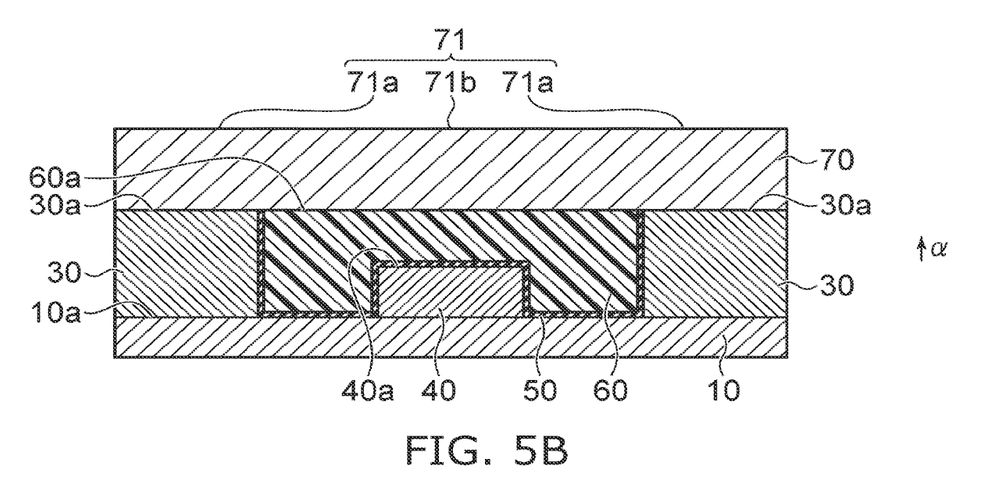
FIG. 5B is a drawing illustrating the method for manufacturing the semiconductor device according to the first embodiment.
Figure 5C:
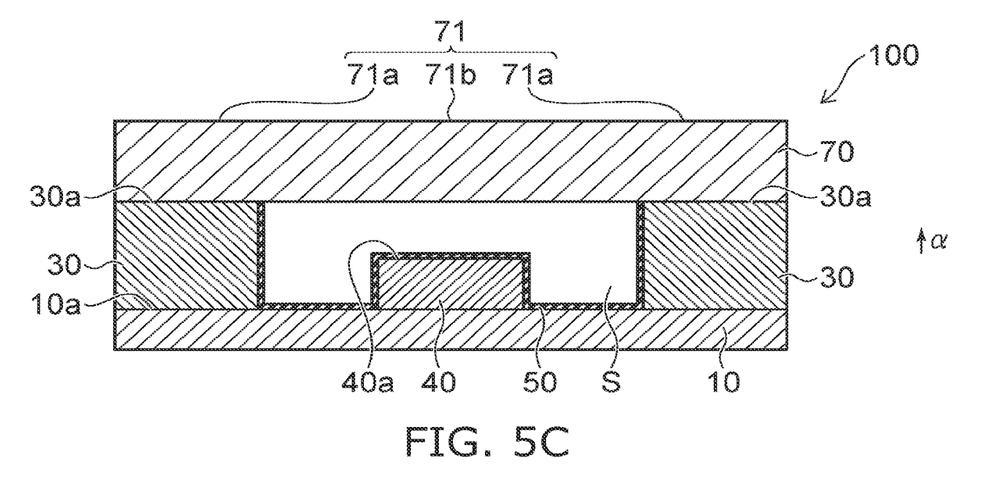
FIG. 5C is a drawing illustrating the method for manufacturing the semiconductor device according to the first embodiment.

FIGS. 5A to 5C are drawings illustrating the method for manufacturing the semiconductor device according to the embodiment.

The method for manufacturing the semiconductor device 100 will now be described using FIGS. 4A to 4C and FIGS. 5A to 5C.

As shown in FIG. 4A, the substrate 10 includes GaAs, GaN, etc. As shown in FIG. 4B, the two source electrodes 30 are provided on the upper surface 10a (the one surface) of the substrate 10. The pair of source electrodes 30 are provided to be separated from each other.

Continuing as shown in FIG. 4B, the gate electrode 40 is provided on the upper surface 10a of the substrate 10. The gate electrode 40 is provided to be separated from the pair of source electrodes 30 between the pair of source electrodes 30. Also, the upper surface 40a of the gate electrode 40 is formed to be lower than the upper surfaces 30a of the source electrodes 30. The gate electrode 40 includes Pt, Ti, and Au. The sequence of forming the source electrode 30 and the gate electrode 40 may start with either one.

Continuing as shown in FIG. 4C, the insulating film 50 is provided on the gate electrode 40, the substrate 10, and the side surfaces of the source electrodes 30 at the gate electrode 40 side. The insulating film 50 is formed by depositing SiN on these surfaces by CVD. The insulating film 50 covers the surface of the substrate 10 positioned between the gate electrode 40 and the source electrodes 30, the surfaces of the pair of source electrodes 30 facing each other, the upper surface 40a of the gate electrode 40, and the surfaces of the gate electrode 40 facing the source electrodes 30. The insulating film 50 is not formed on the upper surfaces 30a of the pair of source electrodes 30.

Then, as shown in FIG. 5A, an airbridge foundation resist 60 is coated to cover these insulating films 50. The airbridge foundation resist 60 is provided by coating a photoresist by spin coating. When coating the photoresist, the photoresist is at substantially the same height as the source electrodes 30; and the front surface of the photoresist and the upper surfaces 30a (the second surfaces) of the source electrodes 30 are caused to be substantially coplanar. In other words, an upper surface 60a of the airbridge foundation resist 60 is formed to be at substantially the same position as the upper surfaces 30a of the pair of source electrodes 30 in the vertical direction. When the upper surface of the airbridge foundation resist 60 provided by spin coating or the like is formed at a higher position than the upper surfaces 30a of the pair of source electrodes 30, the upper portion of the airbridge foundation resist 60 is removed by etching or the like so that the final upper surface 60a of the airbridge foundation resist 60 is positioned at substantially the same position as the upper surfaces 30a of the pair of source electrodes 30 in the vertical direction. Although the airbridge foundation resist 60 is subsequently removed, the height of the airbridge foundation resist 60 is determined by considering the prevention of large effects on the performance of not only the source electrode 30 but also the proximate electrodes and/or interconnects when going through the series of processes.

As shown in FIG. 5B, subsequently, the airbridge 70 is formed by closely adhering Au to the upper surface 60a of the airbridge foundation resist 60 and the upper surfaces 30a of the two source electrodes 30 by plating. The airbridge 70 is formed to ensure a moderate thickness such that the resistance is not too large.

Finally, as shown in FIG. 5C, the entire airbridge foundation resist 60 is removed. By removing the airbridge foundation resist 60, the space S is formed in the region where the airbridge foundation resist 60 had been provided. Accordingly, the shape of the airbridge foundation resist 60 remains in the semiconductor device 100 as the shape of the space S even after removing the airbridge foundation resist 60.

Thus, the airbridge 70 is provided substantially without an unevenness; and the two source electrodes 30 are connected by the airbridge 70 without being connected with the gate electrode 40.

Thus, the two source electrodes 30 are formed so that the upper surfaces 30a (the second surfaces) of the source electrodes 30 are at the same height as the airbridge foundation resist 60 that is subsequently provided. Thereby, the upper surface 71 of the airbridge 70 becomes substantially a plane and is substantially without an unevenness. Even when a force is applied from above, the force is not partially applied and is dispersed. As a result, the airbridge 70 is not easily damaged by an external force; and the short-circuit/damage of the element can be prevented.

Also, this structure is a structure that is applicable also to the airbridge 70 connecting X'-Y' of FIG. 2 and to the source electrode 20a and the source electrode 30 connected by the airbridge 70. Similarly to X-Y, the source electrodes 30 are formed so that the upper surfaces (the second surfaces) of the source electrodes 30 and 20a are at the same height as the airbridge foundation resist 60 that is subsequently provided; thereby, the upper surface of the airbridge 70 is substantially a plane and substantially without an unevenness. Therefore, even when a force is applied from above, the force is not partially applied and is dispersed. As a result, the airbridge 70 is not easily damaged by an external force; and the short-circuit/damage of the element can be prevented.

According to the embodiment as described above, by reducing the unevenness of the airbridge 70, a partial concentration of the force can be suppressed even when an external force is applied to the airbridge 70. Thereby, the semiconductor device 100 and a method for manufacturing the semiconductor device 100 can be provided in which the strength of the airbridge 70 is increased, and the damage and the short-circuit/damage of the element are prevented.

Second Embodiment

According to the first embodiment, the strength with respect to an external force from above is increased by forming the airbridge 70 to be substantially a plane. However, even by such a structure, there are cases where damage undesirably occurs at the connection portions between the airbridge 70 and the source electrodes 30 when the connection is weak. Therefore, according to the second embodiment, damage is prevented by increasing the connection area of the airbridge 70 with the source electrodes 30.

Figure 6:
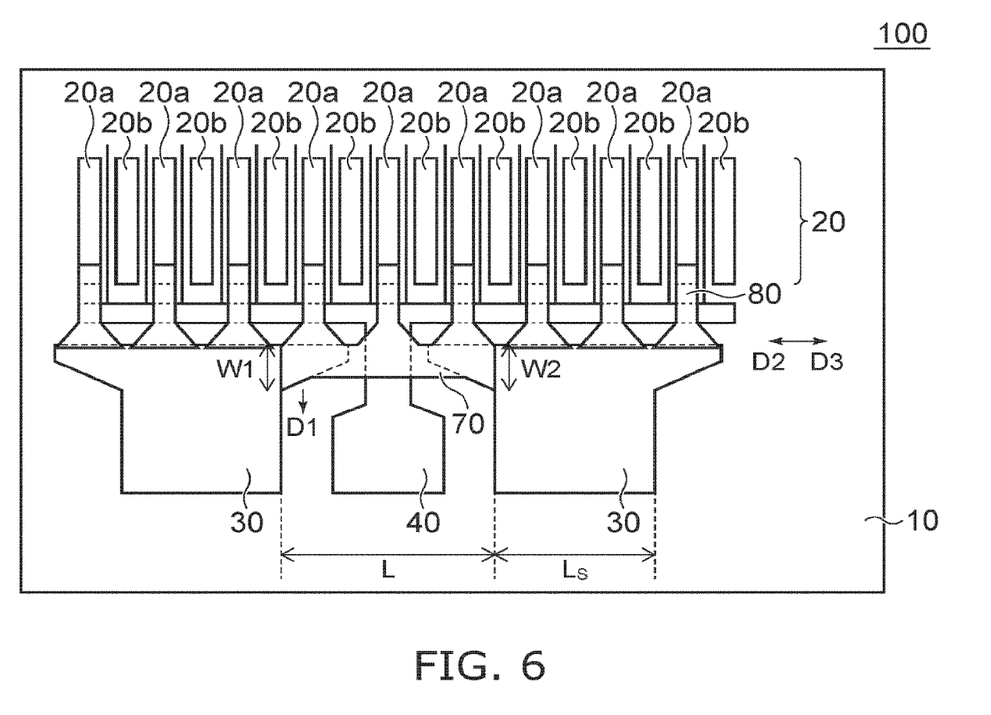
FIG. 6 is a drawing schematically illustrating a semiconductor device according to a second embodiment.

FIG. 6 is a drawing schematically illustrating the semiconductor device according to the embodiment.

Hereinbelow, as in FIG. 6, viewing the semiconductor device 100 in the direction from the source electrode 30 toward the substrate 10 is called "when viewed in top-view".

Two source electrodes 30 and the gate electrode 40 that is between the two source electrodes 30 are provided on the substrate 10. The source electrodes 30 are connected to each other by the airbridge 70 without connecting the electrodes and/or interconnects that are between the source electrodes 30. Also, the ohmic electrodes 20 are provided at positions separated from the source electrodes 30. The ohmic electrodes 20 and the source electrodes 30 are connected by the airbridge 70 without connecting the electrodes and/or interconnects that are between the ohmic electrodes 20 and the source electrodes 30.

As shown in FIG. 6, unlike FIG. 2, widths W1 and W2 of the airbridge 70 are not constant at the connection portions of the source electrodes 30 and the airbridges 70, and are provided to be substantially equal to or greater than the width of the source electrode 30. Also, a length L of the airbridge 70 is long and is provided to the portion at which a width LS of the source electrode 30 starts to widen.

The connection strength of the airbridge 70 and the source electrodes 30 increases as the connection area of the airbridge 70 and the source electrodes 30 increases. On the other hand, when viewed in top-view, the electrostatic capacitance increases and the performance of the circuit of the semiconductor device 100 degrades as the surface area at which the gate electrode 40 and the airbridge 70 overlap increases. When viewed in top-view as shown in FIG. 6, the connection portions of the airbridge 70 to the source electrodes 30 protrude further in a direction D1 crossing the direction in which the pair of source electrodes 30 is arranged than the portion of the airbridge 70 overlapping the gate electrode 40. Thereby, the overlap of the gate electrode 40 and the airbridge 70 can be suppressed while increasing the connection strength of the source electrodes 30 and the airbridge 70.

Also, the semiconductor device 100 includes multiple airbridges 80 that connect the source electrodes 20a and the source electrodes 30. The airbridge 80 extends from the source electrode 20a toward the source electrode 30. The airbridge 80 is connected to the upper surface of the source electrode 20a and the upper surface of the source electrode 30.

When viewed in top-view as shown in FIG. 6, the connection portion of the airbridge 80 to the source electrode 30 protrudes further in directions D2 and D3 crossing the direction in which the pair of source electrodes 20a and 30 is arranged than the portion of the airbridge 80 overlapping the gate electrode 40. Thereby, the overlap of the gate electrode 40 and the airbridge 80 can be suppressed while increasing the connection strength of the source electrode 30 and the airbridge 80.

The manufacturing processes of the manufacturing method according to the second embodiment are similar to those of the first embodiment. The semiconductor device according to the second embodiment can be manufactured by setting the widths and lengths of the airbridges to those of the mask shown in FIG. 6 when forming the airbridge 70 in FIG. 5B.

According to the second embodiment, an airbridge may be provided using a conventional method, or an airbridge may be provided according to the first embodiment.

Thus, according to the second embodiment, the connection area at the connection portion of the airbridge 70 and the source electrode 30 is increased by increasing the width of the airbridge 70 to be about the same width as the source electrode 30; therefore, undesirable damage of the connection portion when an external force is applied from above can be prevented; as a result, the strength can be increased.

According to the embodiment as described above, when viewed in top-view, the connection portions of the airbridges 70 and 80 to the source electrodes 30 protrude further in a direction crossing the direction in which the pair of source electrodes is arranged than the portions of the airbridges 70 and 80 overlapping the gate electrode 40. Thereby, the overlap of the gate electrode 40 and the airbridge 80 can be suppressed while increasing the connection strength of the source electrode 30 and the airbridge 80.

Third Embodiment

Figure 7:
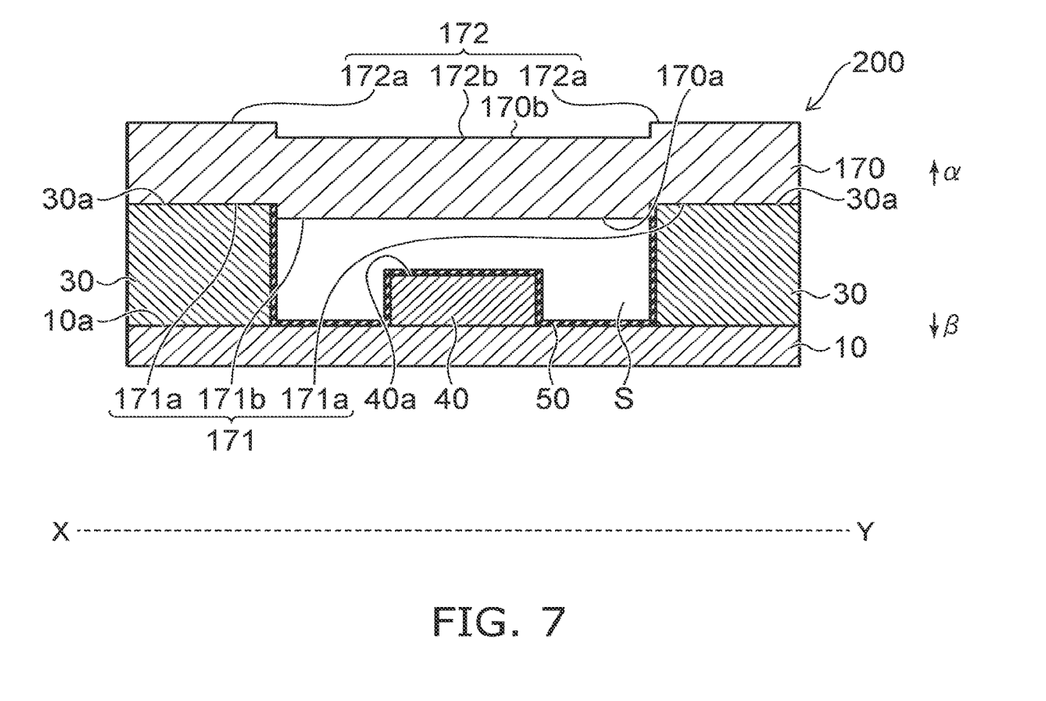
FIG. 7 is a drawing schematically illustrating a cross section of the semiconductor device according to the third embodiment.

FIG. 7 is a drawing schematically illustrating a semiconductor device according to the embodiment.

The shape of an airbridge 170 of the semiconductor device 200 according to the embodiment differs from that of the semiconductor device 100 according to the first embodiment described above. As a general rule in the following description, only the differences with the first embodiment are described. Items other than those described below are similar to those of the first embodiment.

For example, the airbridge 170 is made of a metal material such as Au, etc. The airbridge 170 extends from one source electrode 30 toward another source electrode 30. The airbridge 170 is provided to be separated from the substrate 10 and the gate electrode 40 by the space S. The airbridge 170 is connected to the upper surfaces 30a of the pair of source electrodes 30.

Surfaces of the airbridge 170 include a lower surface 171 and an upper surface 172. The lower surface 171 is a surface that faces the source electrodes 30. The upper surface 172 is a surface at the side opposite to the surface facing the source electrode 30.

The lower surface 171 of the airbridge 170 includes a pair of first regions 171a connected to the upper surfaces 30a of the pair of source electrodes 30, and a second region 171b positioned between the pair of first regions 171a. The second region 171b of the lower surface 171 is positioned at a region directly above the space S. The second region 171b of the lower surface 171 is located at a lower position than the first regions 171a of the lower surface 171. In other words, the airbridge 170 includes a protrusion 170a that protrudes toward the space S.

The upper surface 172 of the airbridge includes a pair of first regions 172a facing the pair of source electrodes 30, and a second region 172b positioned between the pair of first regions 172a. The second region 172b of the upper surface 172 is located at a lower position than the first regions 172a of the upper surface 172. The second region 172b of the upper surface 172 is positioned in at least a portion of a region directly above the space S. In other words, the airbridge 170 includes a recess 170b that is recessed toward the space S. Thus, the shape of the upper surface 172 of the airbridge 170 substantially corresponds to the shape of the lower surface 171.

Figure 8A:
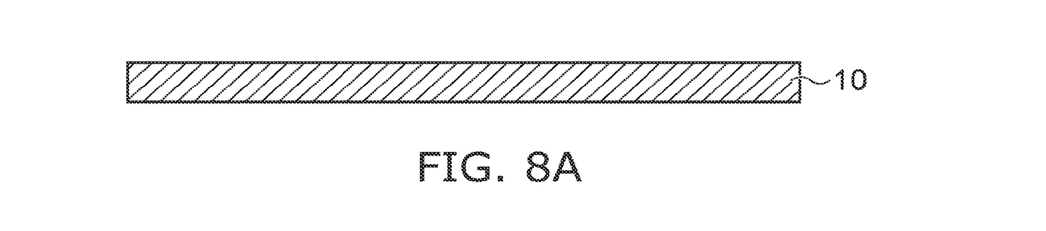
FIG. 8A is a drawing illustrating a method for manufacturing the semiconductor device according to the third embodiment.
Figure 8B:
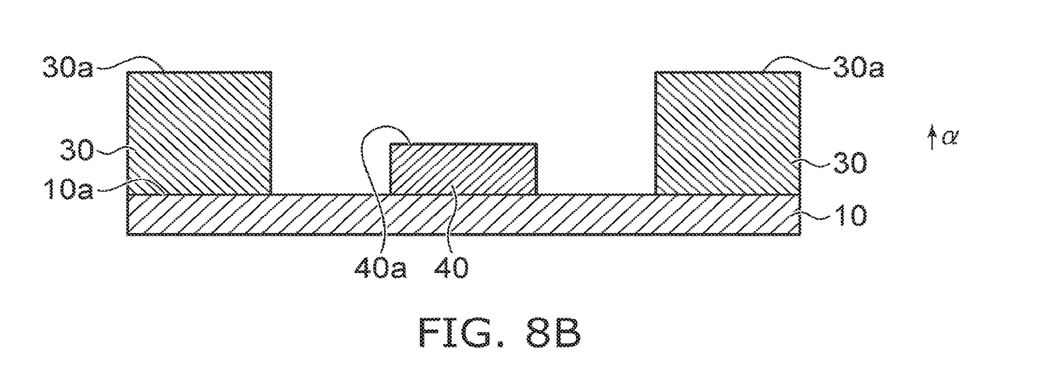
FIG. 8B is a drawing illustrating the method for manufacturing the semiconductor device according to the third embodiment.
Figure 8C:
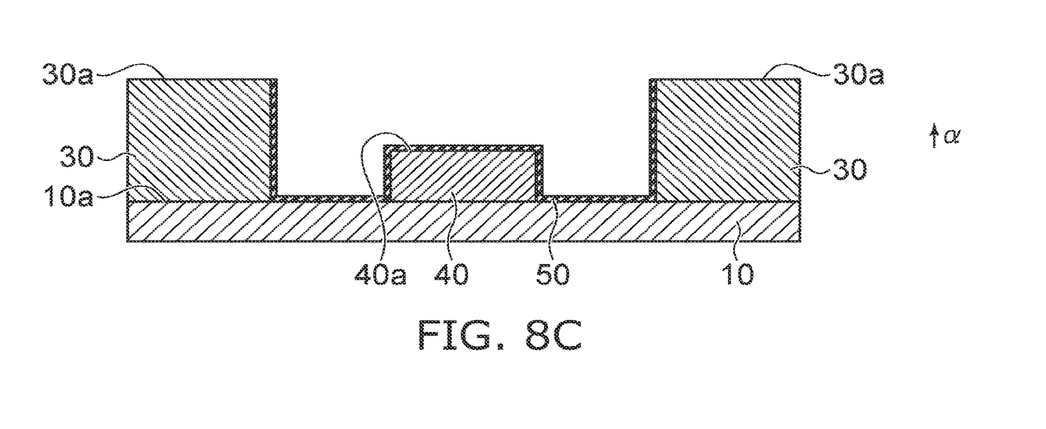
FIG. 8C is a drawing illustrating the method for manufacturing the semiconductor device according to the third embodiment.

FIGS. 8A to 8C are drawings schematically illustrating a method for manufacturing the semiconductor device according to the embodiment.

Figure 9A:
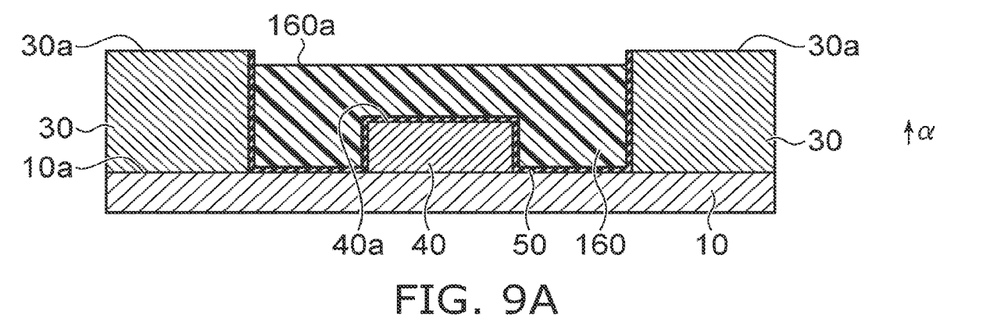
FIG. 9A is a drawing illustrating the method for manufacturing the semiconductor device according to the third embodiment.
Figure 9B:
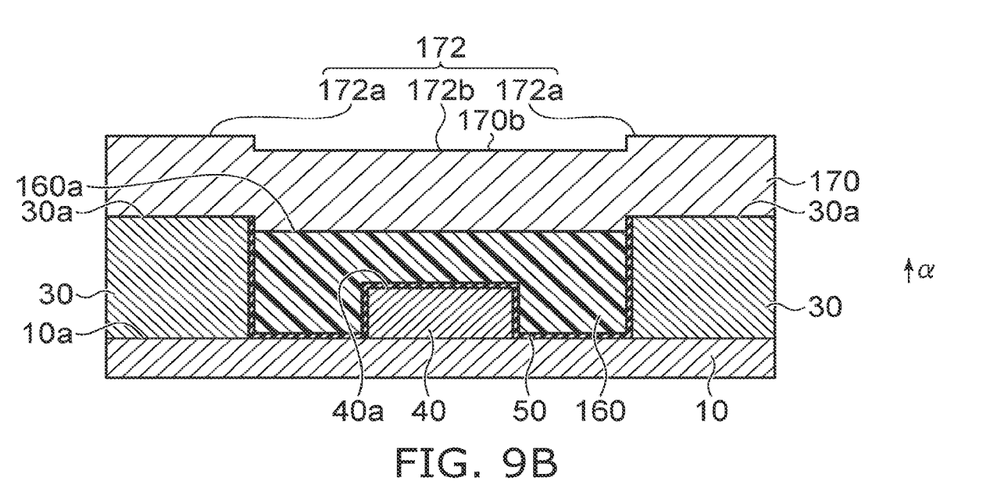
FIG. 9B is a drawing illustrating the method for manufacturing the semiconductor device according to the third embodiment.
Figure 9C:
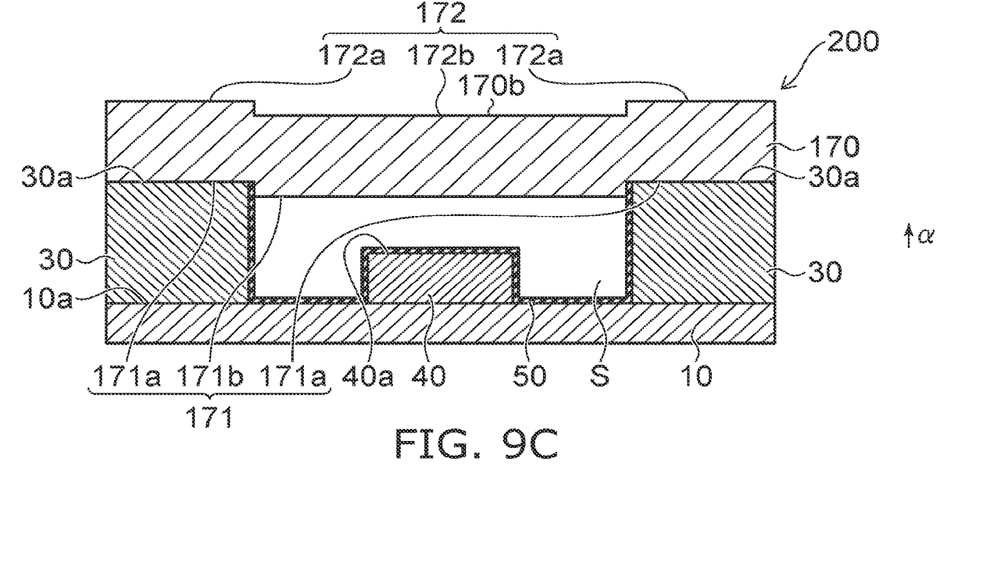
FIG. 9C is a drawing illustrating the method for manufacturing the semiconductor device according to the third embodiment.

FIGS. 9A to 9C are drawings schematically illustrating the method for manufacturing the semiconductor device according to the embodiment.

The method for manufacturing the semiconductor device 200 will now be described with reference to FIGS. 8A to 8C and FIGS. 9A to 9C.

First, the substrate 10 is prepared as shown in FIG. 8A.

Then, as shown in FIG. 8B, the gate electrode 40 and the pair of source electrodes 30 are provided on the upper surface 10a of the substrate 10. The gate electrode 40 is provided to be separated from the pair of source electrodes 30 between the pair of source electrodes 30. Also, the upper surface 40a of the gate electrode 40 is formed at a lower position than the upper surfaces 30a of the pair of source electrodes 30. The sequence of forming the source electrodes 30 and the gate electrode 40 is not particularly limited. The positions of the upper surfaces 30a of the source electrodes 30 are set to positions such that the distance between the upper surface 40a of the gate electrode 40 and the second region 171b of the lower surface 171 of the airbridge 170 provided in a subsequent process is an appropriate distance. For example, the source electrodes 30 are provided on the upper surface 10a of the substrate 10 by vapor deposition, etc. The height of the source electrodes 30 can be increased by vapor deposition.

Then, as shown in FIG. 8C, the insulating film 50 is provided to cover the surface of the substrate 10 between the gate electrode 40 and the source electrodes 30, the surfaces of the pair of source electrodes 30 that face each other, the upper surface of the gate electrode 40, and the surfaces of the gate electrode 40 facing the source electrodes 30. The insulating film 50 is not formed on the upper surfaces 30a of the pair of source electrodes 30.

Then, as shown in FIG. 9A, an airbridge foundation resist 160 is provided between the pair of source electrodes 30. At this time, the airbridge foundation resist 160 is caused to cover the gate electrode 40. Also, an upper surface 160a of the airbridge foundation resist 160 is formed at a lower position than the upper surfaces 30a of the pair of source electrodes 30. Although not particularly limited, for example, the airbridge foundation resist 160 is provided on the substrate 10 by coating a photoresist by spin coating, etc. When the upper surface of the airbridge foundation resist 160 provided by spin coating or the like is formed at the same level as the upper surfaces 30a of the pair of source electrodes 30 or at a higher position than the upper surfaces 30a, the upper portion of the airbridge foundation resist 160 is removed by etching or the like so that the final upper surface 160a of the airbridge foundation resist 160 is positioned at a lower position than the upper surfaces 30a of the pair of source electrodes 30.

Then, as shown in FIG. 9B, the airbridge 170 is provided on the upper surfaces 30a of the pair of source electrodes 30 and the upper surface 160a of the airbridge foundation resist 160. The airbridge 170 is formed in a shape that substantially corresponds to the relative positional relationship of the upper surfaces 30a of the pair of source electrodes 30 and the upper surface 160a of the airbridge foundation resist 160. Although not particularly limited, for example, the airbridge 170 can be provided by plating, etc.

Then, the airbridge foundation resist 160 is removed as shown in FIG. 9C. By removing the airbridge foundation resist 160, the space S is formed in the region where the airbridge foundation resist 160 had been provided. Accordingly, the shape of the airbridge foundation resist 160 remains in the semiconductor device 200 as the shape of the space S even after removing the airbridge foundation resist 160.

As described above, according to the semiconductor device 200 according to the embodiment, the upper surface 172 of the airbridge 170 includes the pair of first regions 172a facing the pair of source electrodes 30, and the second region 172b positioned between the pair of first regions 172a. Also, the second region 172b is located at a lower position than the pair of first regions 172a. In other words, the recess 170b is located in the region of the upper surface 172 of the airbridge 170 positioned directly above the space S. Thereby, when an external force is applied to the upper surface 172 of the airbridge 170, the concentration of the force in the portion of the airbridge 170 positioned directly above the space S can be suppressed. Accordingly, the strength of the airbridge 170 can be increased. This structure also is applicable to the airbridge that connects the source electrode 20a and the source electrode 30 shown in FIG. 2.

Also, according to the method for manufacturing the semiconductor device 200 according to the embodiment, the upper surface 160a of the airbridge foundation resist 160 is formed at a lower position than the upper surfaces 30a of the pair of source electrodes 30. The airbridge 170 is formed in a shape that substantially corresponds to the relative positional relationship of the upper surfaces 30a of the pair of source electrodes 30 and the upper surface 160a of the airbridge foundation resist 160. In other words, the recess 170b is formed in the upper surface 172 of the airbridge 170 in the region positioned directly above the space S. Thereby, when an external force is applied to the upper surface 172 of the airbridge 170, the concentration of the force in the portion of the airbridge 170 positioned directly above the space S can be suppressed. Accordingly, the strength of the airbridge 170 can be increased. The manufacturing method also is applicable to the method for manufacturing the airbridge that connects the source electrode 20a and the source electrode 30 shown in FIG. 2.

Thus, in semiconductor devices according to embodiments as described in the first and third embodiments, the upper surface of the airbridge includes the pair of first regions facing the pair of source electrodes, and the second region positioned between the pair of first regions. Also, the second region is located at a position at or lower than the first region. The protrusion of the region positioned directly above the space at the upper surface of the airbridge can be suppressed thereby. Accordingly, when an external force is applied to the upper surface of the airbridge, the concentration of the force in the portion of the airbridge positioned directly above the space can be suppressed. The strength of the airbridge can be increased thereby.

Also, in methods for manufacturing semiconductor devices according to embodiments as described in the first and third embodiments, the airbridge foundation resist is provided so that the upper surface of the airbridge foundation resist is positioned at a position at or lower than the upper surfaces of the pair of source electrodes. The airbridge is formed in a shape that substantially corresponds to the relative positional relationship of the upper surfaces of the pair of source electrodes and the upper surface of the airbridge foundation resist. The protrusion of the region positioned directly above the space at the upper surface of the airbridge can be suppressed thereby. Accordingly, when an external force is applied to the upper surface of the airbridge, the concentration of the force in the portion of the airbridge positioned directly above the space can be suppressed. The strength of the airbridge can be increased thereby.

According to embodiments described above, a semiconductor device and a method for manufacturing a semiconductor device can be provided in which the strength of an airbridge is increased.

Also, while certain embodiments of the inventions have been described, these embodiments have been presented by way of example only, and are not intended to limit the scope of the inventions. These novel embodiments may be embodied in a variety of other forms; furthermore, various omissions, substitutions, and changes may be made without departing from the spirit of the inventions. Such embodiments and their modifications are within the scope and spirit of the inventions, and are within the scope of the inventions described in the claims and their equivalents.

The invention claimed is:

1. A semiconductor device, comprising:
a substrate;
a pair of source electrodes provided to be separated from each other on an upper surface of the substrate, a direction from one of the pair of source electrodes to another one of the pair of source electrodes being along a first direction;
source portions extending in a second direction crossing the first direction, at least one of the source portions being connected to the one of the pair of source electrodes, at least another one of the source portions being connected to the other one of the pair of source electrodes;
a gate electrode provided on the upper surface of the substrate between the pair of source electrodes, the gate electrode being separated from the pair of source electrodes, an upper surface of the gate electrode being lower than upper surfaces of the pair of source electrodes;
a drain electrode provided between the at least one of the source portions and the at least the other one of the source portions connected to the other one of the pair of source electrodes in the first direction;
an insulating film provided on inside side surfaces of the pair of source electrodes, and over a top surface of the gate electrode; and
an airbridge provided to be separated from the substrate and the gate electrode by a space, the airbridge being connected to the upper surfaces of the pair of source electrodes,
an upper surface of the airbridge including:
a pair of first regions facing the pair of source electrodes, and
a second region positioned between the pair of first regions,
the second region being located at a lower position than the pair of first regions;
a lower surface of the airbridge including:
a pair of third regions and a fourth region between the pair of third regions, the pair of third regions being below the pair of first regions of the upper surface of the airbridge, and the fourth region being below the second region of the upper surface of the airbridge, and
the lower surface of the fourth region being below the lower surface of the pair of third regions;
wherein the inside side surfaces of the pair of source electrodes are covered by the insulating film,
an upper edge of the insulating film is covered by the airbridge, and
the drain electrode is not provided between the substrate and the airbridge in a third direction crossing a plane including the first direction and the second direction.

2. The semiconductor device according to claim 1, wherein
when viewed in top-view, connection portions of the airbridge to the source electrodes protrude further in the third direction than a portion of the airbridge overlapping the gate electrode.

3. The semiconductor device according to claim 2, further comprising:
an insulating film covering a surface of the substrate facing the space, surfaces of the pair of source electrodes facing the space, and a surface of the gate electrode facing the space.

4. The semiconductor device according to claim 1, further comprising:
an insulating film covering a surface of the substrate facing the space, surfaces of the pair of source electrodes facing the space, and a surface of the gate electrode facing the space.

5. A semiconductor device, comprising:
a substrate;
a pair of source electrodes provided to be separated from each other on an upper surface of the substrate, a direction from one of the pair of source electrodes to another one of the pair of source electrodes being along a first direction;
source portions extending in a second direction crossing the first direction, at least one of the source portions being connected to the one of the pair of source electrodes, at least another one of the source portions being connected to the other one of the pair of source electrodes;
a gate electrode provided on the upper surface of the substrate between the pair of source electrodes, the gate electrode being separated from the pair of source electrodes, an upper surface of the gate electrode being lower than upper surfaces of the pair of source electrodes;
a drain electrode provided between the at least one of the source portions and the at least the other one of the source portions connected to the other one of the pair of source electrodes in the first direction;
an insulating film provided on inside side surfaces of the pair of source electrodes, and over a top surface of the gate electrode; and
an airbridge provided to be separated from the substrate and the gate electrode by a space, the airbridge being connected to the upper surfaces of the pair of source electrodes,
an upper surface of the airbridge including a pair of first regions facing the pair of source electrodes, and
a second region positioned between the pair of first regions,
the second region being located at a position at or lower than the pair of first regions;
a lower surface of the airbridge including:
a pair of third regions and a fourth region between the pair of third regions, the pair of third regions being below the pair of first regions of the upper surface of the airbridge, and the fourth region being below the second region of the upper surface of the airbridge, and
the lower surface of the fourth region being below the lower surface of the pair of third regions;
when viewed in top-view, connection portions of the airbridge to the source electrodes protrude further in a direction crossing a direction in which the pair of source electrodes is arranged than a portion of the airbridge overlapping the gate electrode,
wherein the inside side surfaces of the pair of source electrodes are covered by the insulating film,
an upper edge of the insulating film is covered by the airbridge, and
the drain electrode is not provided between the substrate and the airbridge in a third direction crossing a plane including the first direction and the second direction.

6. The semiconductor device according to claim 5, further comprising:
an insulating film covering a surface of the substrate facing the space, surfaces of the pair of source electrodes facing the space, and a surface of the gate electrode facing the space.

7. A method for manufacturing a semiconductor device, comprising:
providing, on an upper surface of a substrate a pair of source electrodes that is separated from each other, and a gate electrode that is located between the pair of source electrodes, a direction from one of the pair of source electrodes to another one of the pair of source electrodes being along a first direction;
the gate electrode being separated from the pair of source electrodes, an upper surface of the gate electrode being lower than upper surfaces of the pair of source electrodes;
providing source portions extending in a second direction crossing the first direction, at least one of the source portions being connected to the one of the pair of source electrodes, at least another one of the source portions being connected to the other one of the pair of source electrodes;
providing a drain electrode between the at least one of the source portions and the at least the other one of the source portions connected to the other one of the pair of source electrodes in the first direction;
providing an insulating film on inside side surfaces of the pair of source electrodes, and over a top surface of the gate electrode;
providing an airbridge foundation resist covering the gate electrode between the pair of source electrodes, an upper surface of the airbridge foundation resist being positioned at a position at or lower than the upper surfaces of the pair of source electrodes;
providing an airbridge on the upper surfaces of the pair of source electrodes and the upper surface of the airbridge foundation resist; and
removing the airbridge foundation resist,
a second region of an upper surface of the airbridge being formed, in the providing of the airbridge, at a lower position than a pair of first regions of the upper surface of the airbridge,
the pair of first regions facing the pair of source electrodes,
the second region being positioned between the pair of first regions;
and further in the providing of the airbridge, a lower surface of the airbridge including:
a pair of third regions and a fourth region between the pair of third regions, the pair of third regions being below the pair of first regions of the upper surface of the airbridge, and the fourth region being below the second region of the upper surface of the airbridge, and
the lower surface of the fourth region being below the lower surface of the pair of third regions;
wherein in the providing the insulating film and the airbridge, the inside side surfaces of the pair of source electrodes are covered by the insulating film,
an upper edge of the insulating film is covered by the airbridge, and
the drain electrode is not provided between the substrate and the airbridge in a third direction crossing a plane including the first direction and the second direction.

* * * * *